United States Patent
Qian et al.

[19]

[11] Patent Number: 6,165,869
[45] Date of Patent: Dec. 26, 2000

[54] METHOD TO AVOID DISHING IN FORMING TRENCHES FOR SHALLOW TRENCH ISOLATION

[75] Inventors: Gang Qian; Chock Hing Gan, both of Singapore, Singapore; Lap Hung Chan, SF, Calif.; Poh Suan Tan, Singapore, Singapore

[73] Assignee: Chartered Semiconductor Manufacturing, Ltd., Singapore, Singapore

[21] Appl. No.: 09/096,047

[22] Filed: Jun. 11, 1998

[51] Int. Cl.⁷ ..................................................... H01L 21/76
[52] U.S. Cl. ........................... 438/424; 438/404; 438/460; 438/221
[58] Field of Search ..................................... 438/424, 400, 438/404, 221

[56] References Cited

U.S. PATENT DOCUMENTS

| | | | |
|---|---|---|---|
| 3,911,474 | 10/1975 | Rosvold | 357/71 |
| 4,576,834 | 3/1986 | Sobczak | 427/93 |
| 5,229,310 | 7/1993 | Sivan | 437/41 |
| 5,399,389 | 3/1995 | Hieber et al. | 427/579 |
| 5,447,884 | 9/1995 | Fahey et al. | 437/67 |
| 5,492,858 | 2/1996 | Bose et al. | 437/67 |
| 5,674,783 | 10/1997 | Jang et al. | 437/195 |
| 5,945,724 | 8/1999 | Parekh et al. | 257/510 |
| 5,994,756 | 11/1999 | Umezawa et al. | 257/510 |

Primary Examiner—Matthew Smith
Assistant Examiner—Granvill D Lee
Attorney, Agent, or Firm—George O. Saile; Rosemary L. S. Pike; Larry J. Prescott

[57] ABSTRACT

A method is described for filling trenches with dielectric for shallow trench isolation which completely fills the trench and avoids problems due to dishing at the top of the trench. A trench is formed in a substrate having a second dielectric material formed thereon. The trench is lined with a third dielectric material. Sub atmospheric chemical vapor deposition, SACVD, of tetra-ethyl-ortho-silicate and ozone is used to grow a fourth dielectric on the surface of the second dielectric material and in the trench lined with the third dielectric material. The growth rate of fourth dielectric on the third dielectric is greater than the growth rate of the fourth dielectric on the second dielectric using SACVD of tetra-ethyl-ortho-silicate and ozone. The difference in growth rate assures that the trench is completely filled with fourth dielectric even for relatively thin layers of fourth dielectric grown on the second dielectric. This provides good planarity for a planarized substrate and avoids the problem of dishing at the top of the trench.

22 Claims, 3 Drawing Sheets

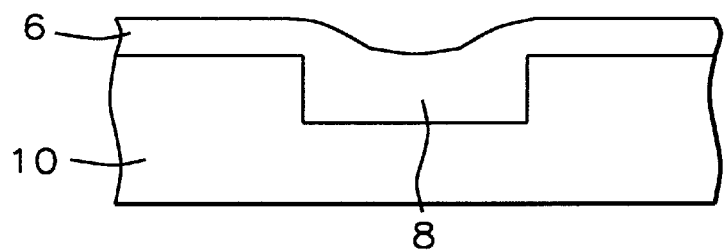
FIG. 1A – Prior Art
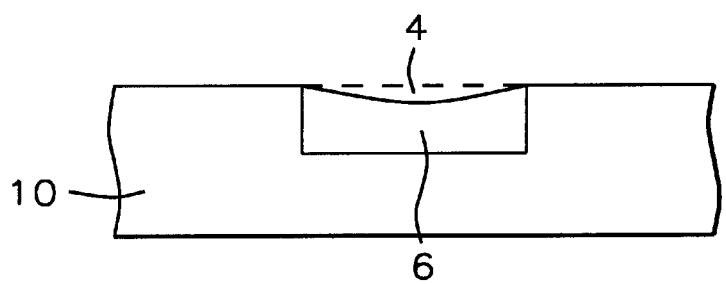
FIG. 1B – Prior Art
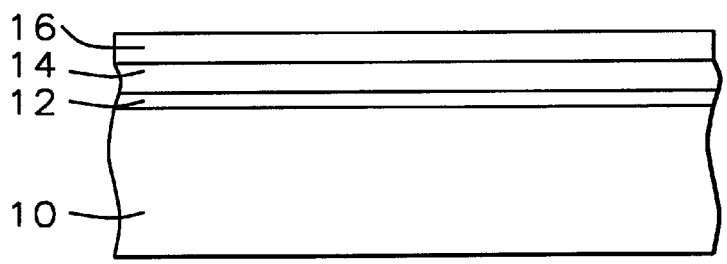
FIG. 2
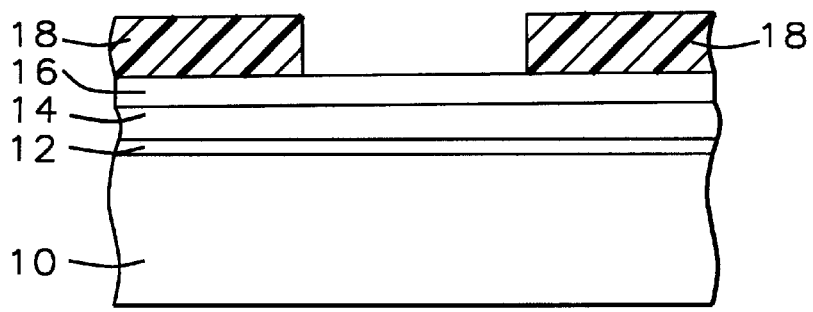
FIG. 3

METHOD TO AVOID DISHING IN FORMING TRENCHES FOR SHALLOW TRENCH ISOLATION

BACKGROUND OF THE INVENTION (1) Field of the Invention

This invention relates to a method of filling trenches for shallow trench isolation which avoids dishing at the top of the trenches. More particularly the invention relates to a method of filling trenches with a dielectric which is formed at a greater rate within the trench than outside of the trench.

(2) Description of the Related Art

U.S. Pat. No. 5,399,389 to Hieber et al. describes a method of planarizing $SiO_2$ layers deposited on structured silicon substrates. The method uses differential growth rates of $SiO_2$ over metallization regions and regions without metallization to eventually achieve a step free film.

U.S. Pat. No. 5,674,783 to Jang et al. describes a method of improving the chemical mechanical polishing uniformity of insulator layers. A substrate has various regions. Some of the regions are masked and exposed regions are treated with a plasma capable of modifying the exposed region so that the insulator grows on the treated region at a faster rate. Other regions can be subsequently exposed to affect the insulator growth rate in other regions.

U.S. Pat. No. 5,492,858 to Bose et al. describes a method of forming trenches for shallow trench isolation in which the trenches are coated with a silicon nitride protective layer before the trenches and active area mesas are coated with a layer of silicon oxide. The silicon oxide is then steam annealed and the wafer is etched and polished down to the tops of the mesas.

U.S. Pat. No. 5,447,884 to Fahey et al. describes a method of forming trenches for shallow trench isolation wherein the trenches are lined with a silicon nitride liner.

U.S. Pat. No. 4,576,834 to Sobczak describes a method of forming trench isolation structures utilizing the conversion of an organosilicon material to silicon oxide.

SUMMARY OF THE INVENTION

As dimensions in integrated circuit wafers continue to decrease the use of shallow trench isolation between circuit segments increases. After filling the shallow trenches used in shallow trench isolation with dielectric the wafers are often planarized to provide a planar surface for subsequent processing steps. The filling of the shallow trenches with dielectric and subsequent planarization step can often lead to dishing at the top of the trench and loss of planarity of the surface of the integrated circuit wafer. FIG. 1A shows a cross section view of an integrated circuit wafer 10 having a trench 8 formed therein and a layer of dielectric 6 formed thereon to fill the trench. As shown in FIG. 1B that part of the dielectric above the plane of the top surface of the wafer 10 is removed using a method such as chemical mechanical polishing, CMP. If the layer of dielectric 6 is not thick enough dishing 4 at the top of the trench occurs during the planarization step and good planarity of the wafer surface is not achieved.

It is a principle objective of this invention to provide a method of filling shallow isolation trenches with dielectric which will prevent dishing at the top of the trench during the planarization step and provide good planarity for the wafer surface.

This objective is achieved by forming a first layer of silicon nitride on the top surface of the wafer, a first layer of silicon oxide on the first layer of silicon nitride and then etching a trench through the first layer of silicon oxide, the first layer of silicon nitride, and into the wafer. A layer of thermal oxide liner is then grown on the sidewalls and bottom of the trench. A second layer of silicon nitride is then formed on the wafer covering the first layer of silicon oxide and the thermal oxide liner on the sidewalls and bottom of the trench. That part of the layer of silicon nitride over the first layer of silicon oxide is then removed using chemical mechanical polishing.

A second layer of silicon oxide is then deposited on the wafer and in the trench using a method, such as sub atmospheric chemical vapor deposition, SACVD, for which the rate of deposition of the silicon oxide on silicon nitride is greater than the formation of silicon oxide on silicon oxide. This completely fills the trench with silicon oxide even when the second layer of silicon oxide formed on the first layer of silicon oxide is relatively thin. After the wafer is planarized, using a method such as chemical mechanical polishing, dishing at the top of the trench is avoided and good wafer planarity is achieved.

BRIEF DESCRIPTION OF THE DRAWINGS

FIG. 1A shows a cross section of a part of a wafer having a trench formed therein and a layer of dielectric formed thereon.

FIG. 1B shows a cross section view of the part of the wafer of FIG. 1A after the wafer has been planarized.

FIG. 2 shows a cross section view of a wafer having a layer of pad oxide, a first layer of silicon nitride, and a first layer of silicon oxide formed thereon.

FIG. 3 shows a cross section view of the wafer of FIG. 2 having a patterned layer of photoresist formed thereon.

DESCRIPTION OF THE PREFERRED EMBODIMENTS

Refer now to FIGS. 2–9 for a detailed description of the method of forming and filling shallow isolation trenches of this invention. FIG. 2 shows a cross section view of a part of a substrate 10, in this example a silicon integrated circuit wafer, having a layer of pad oxide 12 formed thereon and a layer of first dielectric 14 formed on the layer of pad oxide 12. The layer of pad oxide 12, shown in this example, is optional and if it is not used the layer of first dielectric 14 is formed directly on the substrate 10. In this example the layer of first dielectric 14 is a layer of silicon nitride and the layer of pad oxide 12, if used, is a layer of silicon oxide. A layer of second dielectric 16 is then formed on the layer of first dielectric 14. In this example the layer of second dielectric 16 is a layer of silicon oxide.

Figure 4:
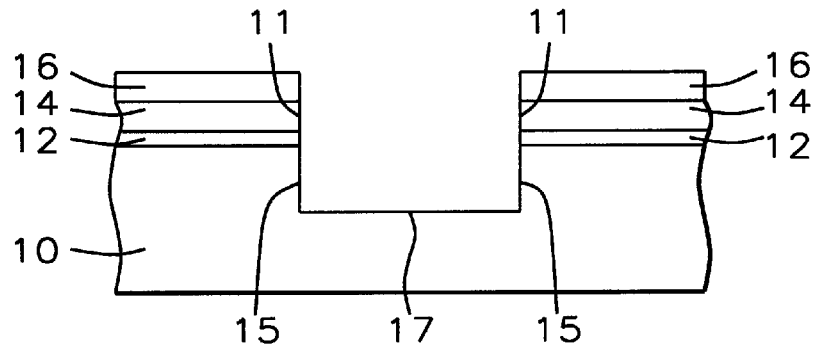
FIG. 4 shows a cross section view of the wafer of FIG. 3 after forming a trench pattern in the first layer of silicon oxide, the first layer of silicon nitride, the layer of pad oxide, forming the trench in the wafer, and removing the photoresist.
Figure 5:
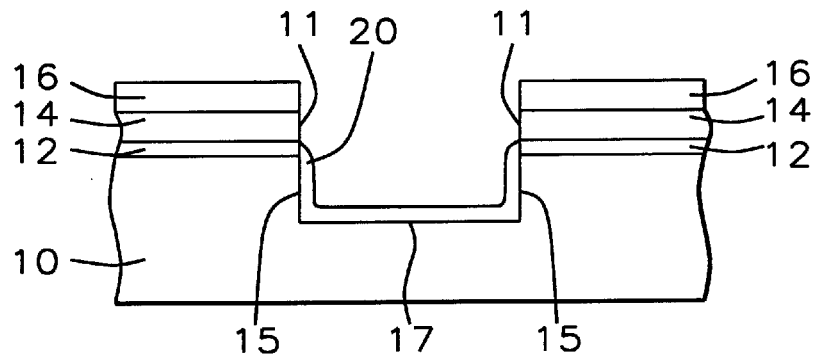
FIG. 5 shows a cross section view of the wafer of FIG. 4 after growing a thermal oxide liner on the sidewalls and bottom of the trench.

As shown in FIG. 3, a patterned layer of resist 18 is formed on the layer of second dielectric 16. A trench pattern, having sidewalls 11, is then etched in the layer of second dielectric 16, the layer of first dielectric 14, and the layer of pad oxide 12, if pad oxide is used. A trench, having sidewalls 15 and a bottom 17, is etched in the substrate 10. The trench pattern and trench are etched during the same etching step using dry anisotropic etching and the patterned layer of resist 18 as a mask. The patterned layer of resist is then removed, see FIG. 4. Next as shown in FIG. 5 an oxide liner 20 is grown on the sidewalls 15 and bottom 17 of the trench formed in the substrate 10. In this example the oxide liner 20 is silicon oxide grown using thermal oxidation of the exposed sidewalls 15 and bottom 17 of the trench.

Figure 6:
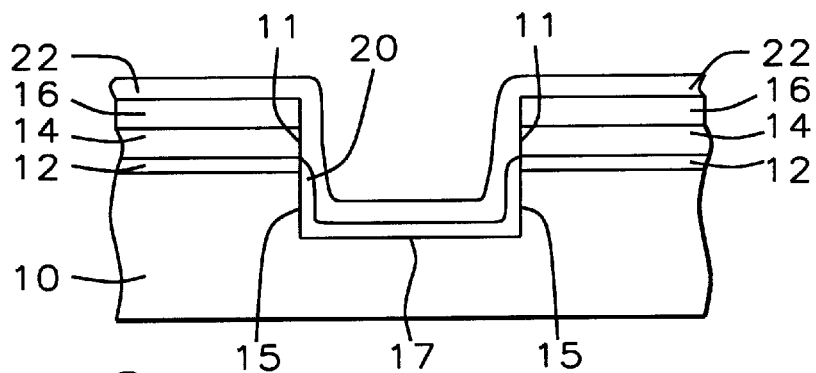
FIG. 6 shows a cross section view of the wafer of FIG. 5 after depositing a second layer of silicon nitride on the first layer of silicon oxide and the thermal oxide liner on the sidewalls bottom of the trench.
Figure 7:
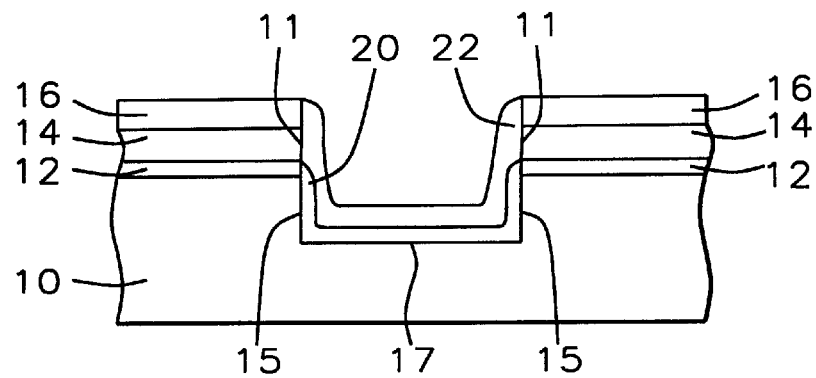
FIG. 7 shows a cross section view of the wafer of FIG. 6 after removing that part of the second layer of silicon nitride from the first layer of silicon oxide.

As shown in FIG. 6, a layer of third dielectric 22 is then formed on the substrate 10 covering the top surface of the patterned layer of second dielectric 16, the sidewalls 11 of the trench pattern, and the oxide liner 20. In this example the layer of third dielectric 22 is a second layer of silicon nitride. Then, as shown in FIG. 7, that part of the layer of third dielectric 22 above the plane of the top surface of the patterned layer of second dielectric 16 is removed using a means such as a first chemical mechanical polishing. This leaves a layer of third dielectric 22 on the sidewalls 11 of the trench pattern formed in the layer of second dielectric 16, the layer of first dielectric 14, and the layer of pad oxide 12, if pad oxide is used. This also leaves a layer of third dielectric 22 on the oxide liner 20 formed on the sidewalls 15 and bottom 17 of the trench. The first chemical mechanical polishing is stopped when the top surface of the layer of second dielectric 16 is reached.

Figure 8:
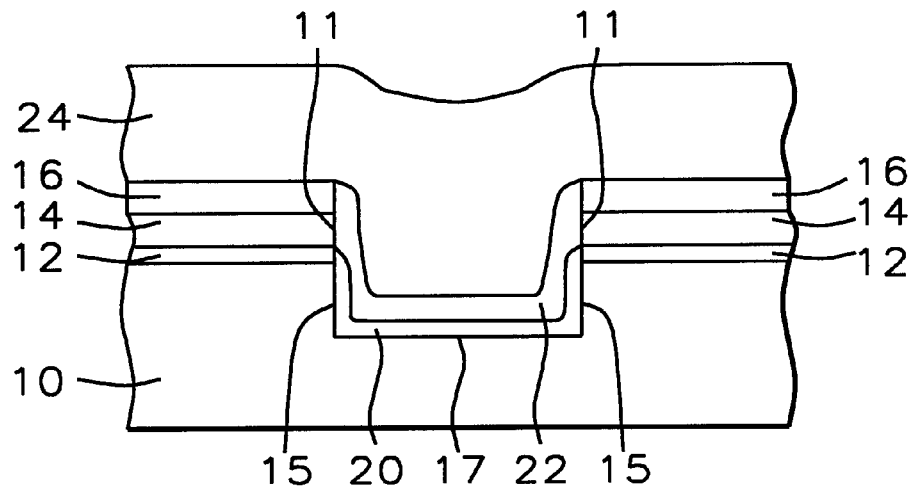
FIG. 8 shows a cross section view of the wafer of FIG. 7 after depositing the second layer of silicon oxide.

Next, as shown in FIG. 8, a layer of fourth dielectric 24 is formed on the wafer using a method for which the rate of formation of the fourth dielectric 24 on the third dielectric 22 is greater than the formation of the fourth dielectric 24 on the second dielectric 16. This difference between the formation rate of the fourth dielectric 24 on the third dielectric 22 and the formation rate of the fourth dielectric 24 on the second dielectric 16 allows the trench to be completely filled even with a relatively thin layer of fourth dielectric 24 on the layer of second dielectric 16. In this example the second dielectric 16 is silicon oxide, the third dielectric 22 is silicon nitride, and the fourth dielectric 24 is silicon oxide wherein the silicon oxide fourth dielectric 24 is deposited using sub atmospheric chemical vapor deposition, SACVD, from tetra-ethyl-ortho-silicate and ozone. This method provides a growth rate of silicon oxide on silicon nitride which is greater than the growth rate of silicon oxide on silicon oxide.

Figure 9:
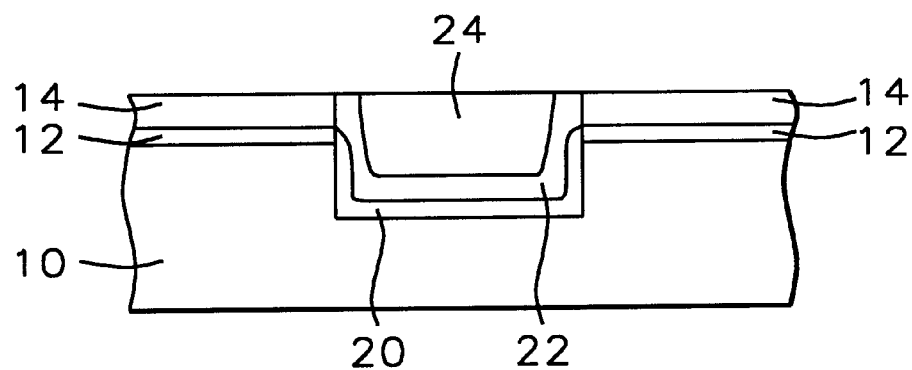
FIG. 9 shows a cross section view of the wafer of FIG. 8 after planarizing the wafer using chemical mechanical polishing.

Next, as shown in FIG. 9, that part of the layer of fourth dielectric 24 and that part of the layer of third dielectric 22 above the plane of the top surface of the layer of first dielectric 14 is removed, using a method such as a second chemical mechanical polishing, thereby leaving fourth dielectric 24 in the trench and an oxide liner 20 and a layer of third dielectric 22 on the sidewalls 15 and bottom 17 of the trench. The second chemical mechanical polishing is stopped when the top surface of the layer of first dielectric 14 is reached. The trench is completely filled with fourth dielectric providing good planarity for subsequent processing steps.

While the invention has been particularly shown and described with reference to the preferred embodiments thereof, it will be understood by those skilled in the art that various changes in form and details may be made without departing from the spirit and scope of the invention.

What is claimed is:

1. A method of forming isolation trenches, comprising the steps of:

providing a substrate;

forming a layer of first dielectric having, a top surface, on said substrate;

forming a layer of second dielectric, having a top surface, on said top surface of said layer of first dielectric;

patterning said layer of first dielectric and said layer of second dielectric thereby forming a trench pattern, having sidewalls, in said layer of first dielectric and said layer of second dielectric;

etching a trench, having sidewalls and a bottom, in said substrate wherein said trench is directly below said trench pattern in said layer of first dielectric and said layer of second dielectric;

forming an oxide liner on said sidewalls and said bottom of said trench;

forming a layer of third dielectric on said top surface of said layer of second dielectric, said sidewalls of said trench pattern, and said oxide liner formed on said sidewalls and bottom of said trench, wherein said layer of third dielectric is formed after said patterning said layer of first dielectric and said layer of second dielectric has been completed;

removing that part of said layer of third dielectric above the plane of said top surface of said layer of second dielectric thereby leaving that part of said layer of third dielectric on said sidewalls of said trench pattern and on said oxide liner formed on said sidewalls and said bottom of said trench;

forming a layer of fourth dielectric on said top surface of said layer of second dielectric and on that part of said layer of third dielectric on said sidewalls of said trench pattern and on said oxide liner formed on said sidewalls and said bottom of said trench, after removing that part of said layer of third dielectric above the plane of said top surface of said layer of said second dielectric, using a method wherein the rate of formation of said fourth dielectric on said third dielectric is greater than the rate of formation of said fourth dielectric on said second dielectric, thereby filling said trench with said fourth dielectric; and removing that part of said layer of fourth dielectric, that part of said layer of third dielectric, and that part of said layer of second dielectric above the plane of said of said top surface of said layer of first dielectric leaving said fourth dielectric in said trench.

2. The method of claim 1 wherein said layer of first dielectric is a layer of silicon nitride.

3. The method of claim 1 wherein said layer of second dielectric is a layer of silicon oxide.

4. The method of claim 1 wherein said layer of third dielectric is a layer of silicon nitride.

5. The method of claim 1 wherein said fourth dielectric is silicon oxide formed using sub atmospheric chemical vapor deposition from tetra-ethyl-ortho-silicate and ozone.

6. The method of claim 1 wherein said second dielectric is silicon oxide, said third dielectric is silicon nitride, said fourth dielectric is silicon oxide, and said fourth dielectric is formed using sub atmospheric chemical vapor deposition from tetra-ethyl-ortho-silicate and ozone.

7. The method of claim 1 wherein said substrate is silicon and said oxide liner is silicon oxide formed by thermal oxidation of silicon.

8. The method of claim 1 wherein said removing that part of said layer of third dielectric above the plane of said top surface of said layer of said second dielectric is accomplished using a first chemical mechanical polishing.

9. The method of claim 1 wherein said removing that part of said layer of fourth dielectric, that part of said layer of third dielectric, and that part of said layer of second dielectric above the plane of said of said top surface of said layer of first dielectric uses a second chemical mechanical polishing.

10. The method of claim 1 wherein said substrate is a silicon integrated circuit wafer.

11. The method of claim 1 wherein said etching a trench having sidewalls and a bottom in said substrate uses vertical dry anisotropic etching.

12. A method of forming isolation trenches, comprising the steps of:

providing a substrate;

forming a layer of pad oxide on said substrate;

forming a layer of first dielectric, having a top surface, on said layer of pad oxide;

forming a layer of second dielectric, having a top surface, on said top surface of said layer of first dielectric;

forming a layer of resist on said top surface of said layer of second dielectric;

patterning said layer of resist, thereby forming a resist mask;

patterning said layer of first dielectric, said layer of second dielectric, and said layer of pad oxide using said resist mask thereby forming a trench pattern having sidewalls in said layer of first dielectric, said layer of second dielectric, and said layer of pad oxide;

etching a trench having sidewalls and a bottom in said substrate using said resist mask wherein said trench is directly below said trench pattern;

removing said resist mask;

forming an oxide liner on said sidewalls and said bottom of said trench;

forming a layer of third dielectric on said top surface of said patterned layer of second dielectric, said sidewalls of said trench pattern, and said oxide liner formed on said sidewalls and bottom of said trench;

removing that part of said layer of third dielectric above the plane of said top surface of said layer of second dielectric thereby leaving that part of said layer of third dielectric on said sidewalls of said trench pattern and on said oxide liner formed on said sidewalls and said bottom of said trench;

forming a layer of fourth dielectric on said top surface of said layer of second dielectric, on that part of said layer of third dielectric formed on said sidewalls of said trench pattern, and on said oxide liner formed on said sidewalls and said bottom of said trench, after removing that part of said layer of third dielectric above the plane of said top surface of said layer of said second dielectric, using a method wherein the rate of formation of said fourth dielectric on said third dielectric is greater than the rate of formation of said fourth dielectric on said second dielectric thereby filling said trench with said fourth dielectric; and removing that part of said layer of fourth dielectric, that part of said layer of third dielectric, and that part of said layer of second dielectric above the plane of said of said top surface of said layer of first dielectric, leaving said fourth dielectric in said trench.

13. The method of claim 12 wherein said layer of first dielectric is a layer of silicon nitride.

14. The method of claim 12 wherein said layer of second dielectric is a layer of silicon oxide.

15. The method of claim 12 wherein said layer of third dielectric is a layer of silicon nitride.

16. The method of claim 12 wherein said fourth dielectric is silicon oxide formed using sub atmospheric chemical vapor deposition from tetra-ethyl-ortho-silicate and ozone.

17. The method of claim 12 wherein said second dielectric is silicon oxide, said third dielectric is silicon nitride, said fourth dielectric is silicon oxide, and said fourth dielectric is formed using sub atmospheric chemical vapor deposition from tetra-ethyl-ortho-silicate and ozone.

18. The method of claim 12 wherein said substrate is silicon and said oxide liner is silicon oxide formed by thermal oxidation of silicon.

19. The method of claim 12 wherein said removing that part of said third dielectric above the plane of said top surface of said layer of second dielectric uses a first chemical mechanical polishing.

20. The method of claim 12 wherein said removing that part of said layer of fourth dielectric, that part of said layer of third dielectric, and that part of said layer of second dielectric above the plane of said of said top surface of said layer of first dielectric uses a second chemical mechanical polishing.

21. The method of claim 12 wherein said substrate is a silicon integrated circuit wafer.

22. The method of claim 12 wherein said etching said trench having sidewalls and a bottom in said substrate uses vertical dry anisotropic etching.

* * * * *